United States Patent [19]
Uda et al.

[11] Patent Number: 5,559,457
[45] Date of Patent: Sep. 24, 1996

[54] DOUBLE-BALANCED MIXER CIRCUIT

[75] Inventors: Hisanori Uda; Tetsuro Sawai; Toshikazu Imaoka; Toshikazu Hirai; Yasoo Harada, all of Moriguchi, Japan

[73] Assignee: Sanyo Electric Co., Ltd., Osaka, Japan

[21] Appl. No.: 215,193

[22] Filed: Mar. 21, 1994

[30] Foreign Application Priority Data

Mar. 26, 1993 [JP] Japan .................................. 5-093763
Dec. 9, 1993 [JP] Japan .................................. 5-309503

[51] Int. Cl.$^6$ ............................ H04B 1/28; H04B 1/26
[52] U.S. Cl. .................. 327/116; 327/113; 327/355; 327/356; 327/254; 327/231; 333/138; 333/100; 455/326; 455/333
[58] Field of Search ............................ 455/333, 325, 455/323, 326; 327/252, 113, 116, 356, 357, 231, 238, 254, 355, 103, 350, 255; 333/139, 100, 138

[56] References Cited

U.S. PATENT DOCUMENTS

| | | | |
|---|---|---|---|
| 4,308,473 | 12/1981 | Carnes | 327/356 |
| 4,658,440 | 4/1987 | Pavio et al. | 455/333 |
| 5,023,576 | 6/1991 | Staudinger et al. | 335/100 |
| 5,060,298 | 10/1991 | Waugh et al. | 455/333 |
| 5,303,417 | 4/1994 | Laws | 455/333 |

FOREIGN PATENT DOCUMENTS

| | | | |
|---|---|---|---|
| 6120762 | 4/1994 | Japan | 333/100 |

OTHER PUBLICATIONS

"GaAs Dual–Gate FET for Operation Up To K–Band"-IEEE Transaction On Microwave Theory and Techniques, (vol. MTT-32, No. 3) pp. 256– 260, Mar. 1984.

"Wide Bandwidth MMIC Power Dividers: Implementation And A Practice Design Technique" –Microwave Journal, pp. 73–74, 78, 80, 82, and 90, Feb. 1990.

"Low Power Quadrature Modulator IC's For Digital Mobile Radios" —The 3rd Asia–Pacific Microwave Conference Proceedings, Tokyo, pp. 771–774, 1990.

*Primary Examiner*—Timothy P. Callahan
*Assistant Examiner*—Dinh T. Le
*Attorney, Agent, or Firm*—Darby & Darby, P.C.

[57] ABSTRACT

A double-balanced mixer circuit which consumes less power, and is capable of operating on a low voltage power source, because an output of a first signal having a phase lag of 90° from a first frequency signal and an output of a second signal having a phase lead of 90° over the first frequency signal are provided by means of a first phase shifter, an output of a third signal having a phase lag of 90° from a second frequency signal and an output of fourth signal having a phase lead of 90° over the second frequency signal are provided by means of a second phase shifter, thereby generating a radio frequency signal by mixing the first signal and the third signal in a first dual gate circuit, and generating a radio frequency signal by mixing the second signal and the fourth signal in a second dual gate circuit.

11 Claims, 9 Drawing Sheets

[//]: # (Page 1)

DOUBLE-BALANCED MIXER CIRCUIT

BACKGROUND OF THE INVENTION

1. Field of the Invention

The present invention relates to a double-balanced mixer circuit used for mixing signals of different frequencies.

2. Description of Related Art

In a portable telephone, for example, a local oscillation frequency signal and an intermediate frequency signal are mixed in a mixer circuit to generate a radio frequency signal which is to be transmitted. Because mixing of signals having different frequencies is based on a non-linear characteristic, outputs from the mixer circuit include, in addition to the radio frequency signal obtained by mixing, the individual local oscillation frequency signal which is not mixed and the individual intermediate frequency signal which is not mixed. In order to suppress the individual local oscillation frequency signal and the individual intermediate frequency signal, a double-balanced mixer circuit is commonly used for the mixer circuit.

Figure 1:
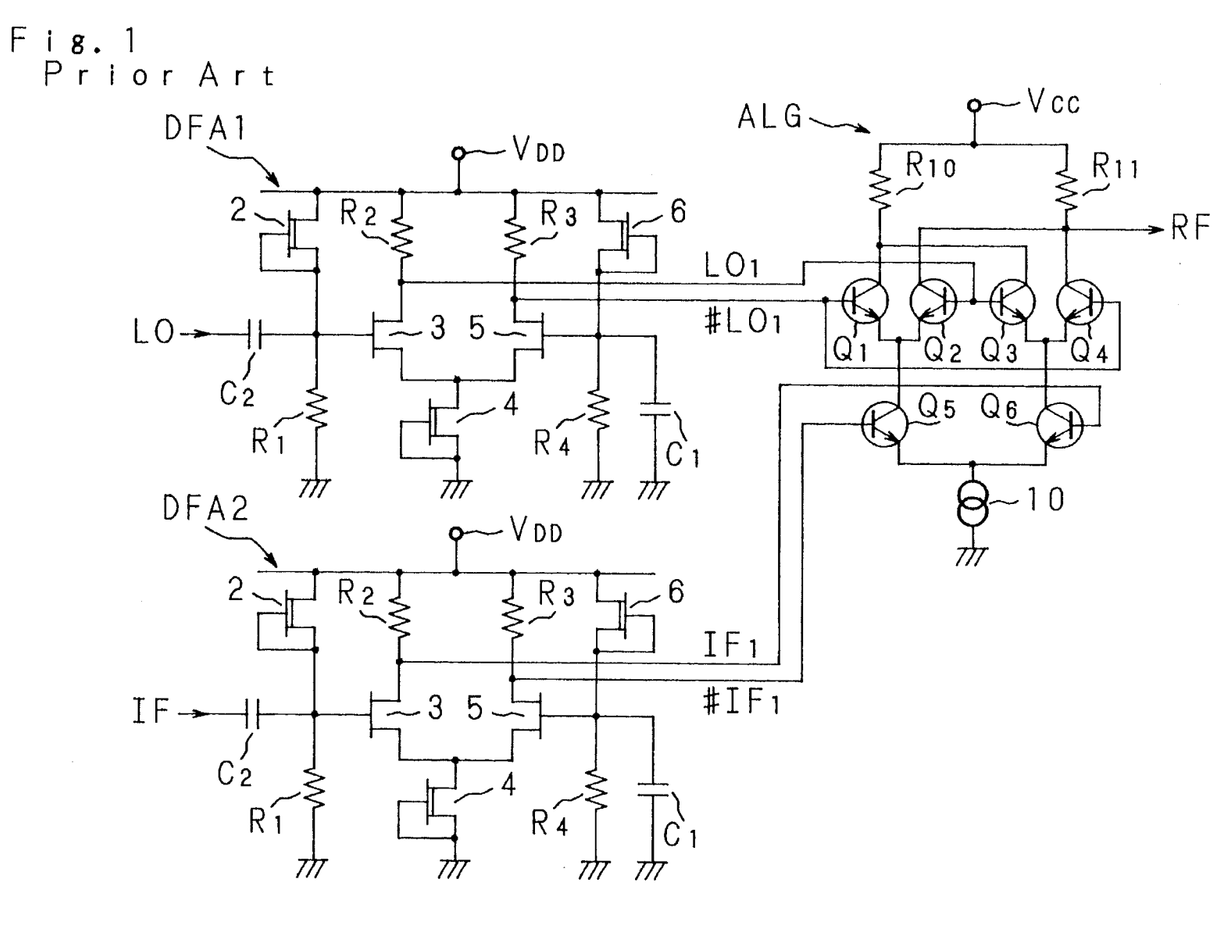
FIG. 1 is a circuit diagram of a conventional double-balanced mixer circuit.

FIG. 1 shows a circuit diagram of a conventional double-balanced mixer circuit. The double-balanced mixer circuit comprises a differential amplifier circuit DFA1 which outputs a signal $LO_1$ of the same phase as the local oscillation frequency signal LO and a signal #$LO_1$ obtained by an 180° phase shift on the local oscillation frequency signal LO upon input of the local oscillation frequency signal LO (frequency LO), a differential amplifier circuit DFA2 which outputs a signal $IF_1$ of the same phase as the intermediate frequency signal IF (frequency IF) and a signal #$IF_1$ obtained by 180° phase shift on the intermediate frequency signal IF upon input of the intermediate frequency signal IF, and an analog multiplier circuit ALG which mixes the local oscillation frequency signal LO and the intermediate frequency signal IF upon input of the signals $LO_1$ and #$LO_1$ which are output from the differential amplifier circuit DFA1 and the signals $IF_1$ and #$IF_1$ which are output from the differential amplifier circuit DFA2.

In the differential amplifier circuit DFA1, a power supply $V_{DD}$ is grounded via ann series circuit of an FET (field effect transistor) 2 and a resistor $R_1$, and is grounded via a series circuit of a resistor $R_2$, an FET 3 and an FET 4. In parallel with the series circuit of the resistor $R_2$ and the FET 3, a series circuit of a resistor $R_3$ and a FET 5 is connected. The power supply $V_{DD}$ is further grounded via a series circuit of an FET 6 and a resistor $R_4$, with a capacitor $C_1$ being connected in parallel with the resistor $R_4$. The junction of the FET 2 and the resistor $R_1$ is connected to one terminal of the capacitor $C_2$ and to the gate of the FET 3. The local oscillation frequency signal LO is fed to the other terminal of the capacitor $C_2$. The gate of the FET 5 is connected to the junction of the FET 6, the resistor $R_4$ and the capacitor $C_1$. The signal $LO_1$ of the same phase as the local oscillation frequency signal LO is output from the junction of the resistor $R_2$ and the FET 3, and the signal #$LO_1$ of the phase being shifted from that of the local oscillation frequency signal LO by 180° is output from the junction of the resistor $R_3$ and the FET 5.

The differential amplifier circuit DFA2 is made in a similar constitution as that of the differential amplifier circuit DFA1, and identical components are assigned the same numerals. In the differential amplifier circuit DFA2, the intermediate frequency signal IF is supplied to other terminal of the capacitor $C_2$. The signal $IF_1$ of the same phase as the intermediate frequency signal IF is output from the junction of the resistor $R_2$ and the FET 3, and a signal #$IF_1$ of the phase being shifted from that of the intermediate frequency signal IF by 180° is output from the junction of the resistor $R_3$ and the FET 5.

In the analog multiplier circuit ALG, a power source $V_{CC}$ is connected to one terminal of a current source 10 via a series circuit of a resistor $R_{10}$ ($R_{11}$), a transistor $Q_1$ ($Q_4$) and a transistor $Q_5$ ($Q_6$), with another terminal of the current source 10 being grounded. The junction of the resistor $R_{10}$ ($R_{11}$) and the transistor $Q_1$ ($Q_4$) is connected to the junction of the transistor $Q_4$ ($Q_1$) and the transistor $Q_6$ ($Q_5$) via the transistor $Q_3$ ($Q_2$). The bases of the transistors $Q_2$ and $Q_3$ are connected to each other and the bases of the transistors $Q_1$ and $Q_4$ are connected to each other. The radio frequency signal RF generated by mixing the local oscillation frequency signal LO and the intermediate frequency signal IF is output from the junction of the resistor $R_{11}$, the transistor $Q_2$ and the transistor $Q_4$.

On the other hand, the signal $LO_1$ (#$LO_1$) from the differential amplifier circuit DFA1 is inputted to the bases of the transistors $Q_2$ and $Q_3$ ($Q_1$ and $Q_4$), and the signal $IF_1$ (#$IF_1$) from the differential amplifier circuit DFA2 is inputted to the bases of the transistor $Q_6$ ($Q_5$).

The operation of the double-balanced mixer circuit will now be described below.

When the local oscillation frequency signal LO is inputted to the differential amplifier circuit DFA1, the signal $LO_1$ having the same phase as the local oscillation frequency LO and the signal #$LO_1$ having a phase 180° shifted from the local oscillation frequency LO are inputted from the differential amplifier circuit DFA1 to the analog multiplier circuit ALG. When the intermediate frequency signal IF is inputted to the differential amplifier circuit DFA2, the signal $IF_1$ having the same phase as the intermediate frequency signal IF and the signal #$IF_1$ having a phase 180° shifted from the intermediate frequency signal IF are inputted from the differential amplifier circuit DFA2 to the analog multiplier circuit ALG. Then the analog multiplier circuit ALG outputs the radio frequency signals RF having frequencies of LO+IF and LO–IF generated by mixing the local oscillation frequency signal LO and the intermediate frequency signal IF.

The signal $LO_1$ and the signal #$LO_1$ cancel each other, and the signal $IF_1$ and the signal #$IF_1$ cancel each other, so that the signals $LO_1$, #$LO_1$, $IF_1$ and #$IF_1$ are not output individually, thereby improving the S/N ratio of the radio frequency signal RF.

The phase of a signal to be mixed can also be shifted by changing the path length. And the required change in the path length decreases as the frequency becomes higher. Therefore the method of changing the path length is employed in applications with frequencies 10 GHz or higher, in consideration of the degree of circuit integration.

Figure 2:
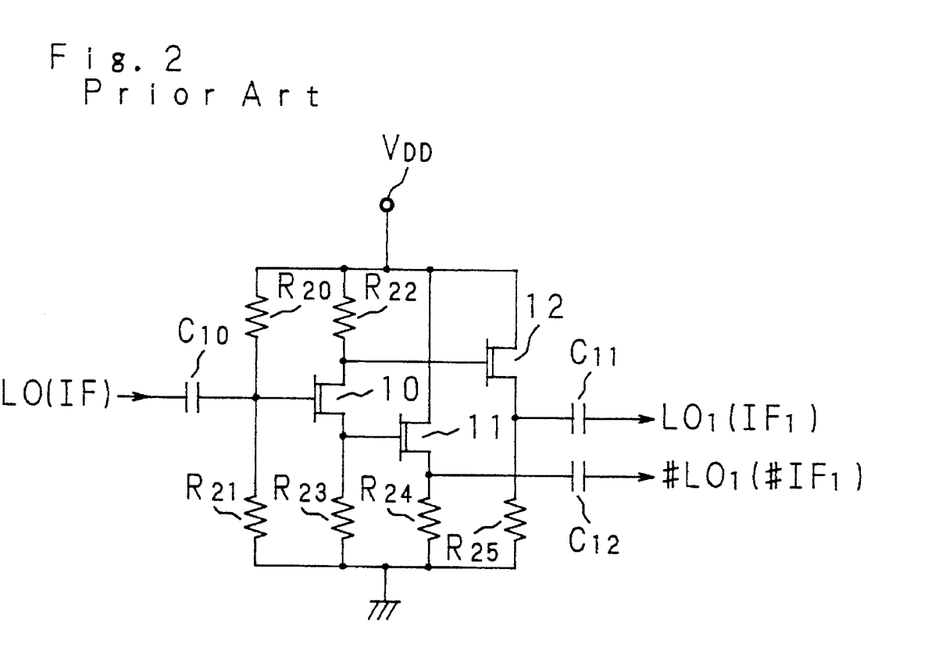
FIG. 2 is a circuit diagram of a phase inverter circuit.

Such a circuit is also employed in which phase inverter circuits are employed for the differential amplifier circuits DFA1 and DFA2 for phase shift. FIG. 2 shows a circuit diagram of a phase inverter circuit. The power supply $V_{DD}$ is grounded via a circuit comprising a parallel connection of a series circuit of a resistor $R_{20}$ and a resistor $R_{21}$, a series circuit of a resistor $R_{22}$, an FET 10 and a resistor $R_{23}$, a series circuit of an FET 11 and a resistor $R_{24}$, and a series circuit of an FET 12 and a resistor $R_{25}$.

The junction of the resistors $R_{20}$ and $R_{21}$ is connected to one terminal of a capacitor $C_{10}$ and to the gate of the FET 10, while the local oscillation frequency signal LO or the intermediate frequency signal IF is fed to the other terminal of the capacitor $C_{10}$.

The junction of the resistor $R_{22}$ and the FET 10 is connected to the gate of the FET 12, and the junction of the FET 10 and the resistor $R_{23}$ is connected to the gate of the FET 11. The signal $LO_1$ having the same phase as that of the local oscillation frequency signal LO or the signal $IF_1$ having the same phase as that of the intermediate frequency signal IF is output from the junction of the FET 12 and the resistor $R_{25}$ via the capacitor $C_{11}$. The signal #$LO_1$ having a phase being shifted by 180° from the local oscillation frequency signal LO or the signal #$IF_1$ having a phase being shifted by 180° from the intermediate frequency signal IF is output from the junction of the FET 11 and the resistor $R_{24}$ via the capacitor $C_{12}$.

Also in the case where this phase inverter circuit is used, similarly to the case where the differential amplifier circuit is employed, the signal $LO_1$ of the same phase as the local oscillation frequency signal LO and the signal #$LO_1$ obtained by 180° phase shift from the local oscillation frequency signal LO are obtained from the phase inverter circuit upon input of the local oscillation frequency signal LO, and the signal $IF_1$ of the same phase as that of the intermediate frequency signal IF and the signal #$IF_1$ obtained by 180° phase shift from the intermediate frequency signal IF are obtained from the phase inverter circuit upon input of the intermediate frequency signal IF.

The conventional double-balanced mixer circuit as described above is capable of good double-balanced mixing operation with less signal attenuation. However, because the conventional double-balanced mixer circuit comprises the differential amplifier circuits or the phase inverter circuit employing a number of FETs and the analog multiplier circuit employing a number of transistors, it consumes a considerable amount of power, and is therefore not suitable for the application in a portable telephone which has a limitation in the power consumption. Because the differential amplifier circuit, the phase inverter circuit and the analog multiplier circuit employ cascaded FETs and transistors, a significant voltage drop occurs and it is difficult to drive the portable telephone by a low-voltage power source, for example a 3 V power source, which is required in the portable telephone.

Also because a portable telephone uses the radio frequency signal RF having a frequency of 1.9 GHz, a GaAs MESFET (Metal Semiconductor FET) which has excellent high-frequency characteristics is more suitable than transistors based on Si. However, a GaAs MESFET is likely to depart from the linear small signal operation region when a signal having voltage amplitude greater than a certain level (for example, 0.1 to 0.2 V or higher) is inputted to the gate thereof, making it impossible to obtain a linear output. Because the local oscillation frequency signal and the intermediate frequency signal commonly used in a portable telephone have voltage amplitude of 0.1 V or higher, in a differential amplifier circuit made by using GaAs MESFETs as described above, a gate of the GaAs MESFET receives an input voltage higher than the level which gives a linear output, and results in such a problem as the distortion of the phase-shifted signals.

SUMMARY OF THE INVENTION

The invention has been conceived to solve the problems described above, and has a major object of providing a double-balanced mixer circuit which consumes a small amount of power and is capable of using a low voltage power source, by reducing the number of FETs (or transistors) being used.

Another object of the invention is to provide a double-balanced mixer circuit which is capable of outputting the radio frequency signal which has a high S/N ratio by means of a circuit wherein no FET (or transistor) is used in the first phase shifter and the second phase shifter.

The double-balanced mixer circuit of the invention comprises two phase shifters outputting signals whose phases are different from each other by 180° and two dual gate FETs to which said signals are inputted.

The double-balanced mixer circuit of the invention has a first phase shifter which outputs a first signal having a phase lag of 90° from a first frequency signal and a second signal having a phase lead of 90° over the first frequency signal upon input of the first frequency signal, and a second phase shifter which outputs a third signal having a phase lag of 90° from a second frequency signal and a fourth signal having a phase lead of 90° over the second frequency signal upon input of the second frequency signal which has a frequency different from that of the first signal. The first signal and the third signal are inputted to a first dual gate circuit and are mixed in the first dual gate circuit. Said second signal and said fourth signal are inputted to a second dual gate circuit and are mixed in the second dual gate circuit. The first dual gate circuit and the second dual gate circuit are arranged so that the output signals thereof are superposed with each other.

In the double-balanced mixer circuit having the constitution as described above, when the first frequency signal is inputted to the first phase shifter, the first phase shifter outputs the first signal having a phase lag of 90° from the first frequency signal and a second signal having a phase lead of 90° over the first frequency signal. When the second frequency signal is inputted to the second phase sifter, the second phase shifter outputs the third signal having a phase lag of 90° from the second frequency signal and the fourth signal having a phase lead of 90° over the second frequency signal.

The dual gate circuit is applied as a means for mixing signals based on non-linear characteristic. The dual gate circuit comprises a dual gate FET to use the non-linear characteristic of the dual gate FET. The principle will be briefly described below. Generally, the non-linear characteristic is capable of approximating the output by expanding the input in a progression. In the progression expansion expression, the first degree term shows the signals amplified and damped original signals, the second degree term shows the sum signal and the difference signal obtained the product of input signals, which are also amplified and damped. Although the signals corresponding to the third or higher degree term are output, these signals are small enough in amplitude to be disregarded.

The first dual gate circuit which has received the inputs of the first signal and the third signal outputs a signal generated by mixing the first signal and the third signal, the individual first signal and the individual third signal. The second dual gate circuit which has received the inputs of the second signal and the fourth signal outputs a signal generated by mixing the second signal and the fourth signal, the individual second signal and the individual fourth signal. The sum signal obtained by mixing the second signal and the fourth signal has the same phase as the sum signal obtained by mixing the first signal and the third signal. The difference signal obtained by mixing the second signal and the fourth signal has the same phase as the difference signal obtained by mixing the first signal and the third signal. When the signals output by the first dual gate circuit and the signals output by the second dual gate circuit are superposed, the original first and the individual second signals cancel each other and vanish because they are out of phase by 180°. Similarly, the individual third and the individual fourth signals cancel each other and vanish because they are out of phase by 180°. By superposing the sum signal of the first signal and the third signal and the sum signal of the second signal and the fourth signal, the signal whose amplitude is twice the sum signal of the first signal and the third signal is generated. By superposing the difference signal of the first signal and the third signal and the difference signal of the second signal and the fourth signal, the signal whose amplitude is twice the difference signal of the first signal and the third signal is generated. Consequently, only the radio frequency signal generated by mixing the first frequency signal and the second frequency signal is output.

The dual gate circuit which mixes the signals whose phases are different by 180° needs less FETs and transistors than the prior art, and needs no cascaded circuit of FETs, so that it is capable of reducing the power consumption in the circuit and using a lower voltage power source. The invention does not employ FETs (or transistors) in the first phase shifter and the second phase shifter. Consequently, it is capable of driving the double-balanced mixer circuit by even less power consumption and lower voltage, and also capable of obtaining an output signal which has a high S/N ratio because phase-shifted signals are not distorted.

Further another object of the invention is to provide a double-balanced mixer circuit capable of preventing the signal output from one duel gate circuit from entering the other dual gate circuit.

The double-balanced mixer circuit of the invention is further made in such a way that it includes, in addition to the first phase shifter, the second phase shifter, the first dual gate circuit and the second dual gate circuit, a coupler which, when the output signal of the first dual gate circuit and the output signal of the second dual gate circuit are inputted thereto, provides the superposed signal of the outputs on the output side thereof.

In this double-balanced mixer circuit, when the output signal of the first dual gate circuit and the output signal of the second dual gate circuit are inputted to the coupler, the radio frequency signal generated by superposing these signals is output.

Consequently, in view of the output side of the coupler, the possibility of the reverse flow of the radio frequency signal which is output from the coupler into the first dual gate circuit or the second dual gate circuit is reduced by setting the sum of the impedance of the components of the coupler and the output impedance of the FET which constitutes the dual gate circuit to a value higher than the impedance of the external circuit connected to the radio frequency output terminals.

The above and further objects and features of the invention will more fully be apparent from the following detailed description with accompanying drawings.

DESCRIPTION OF THE PREFERRED EMBODIMENTS

Now the invention will be described in detail below with reference to the drawings illustrative of the preferred embodiments.

Figure 3:
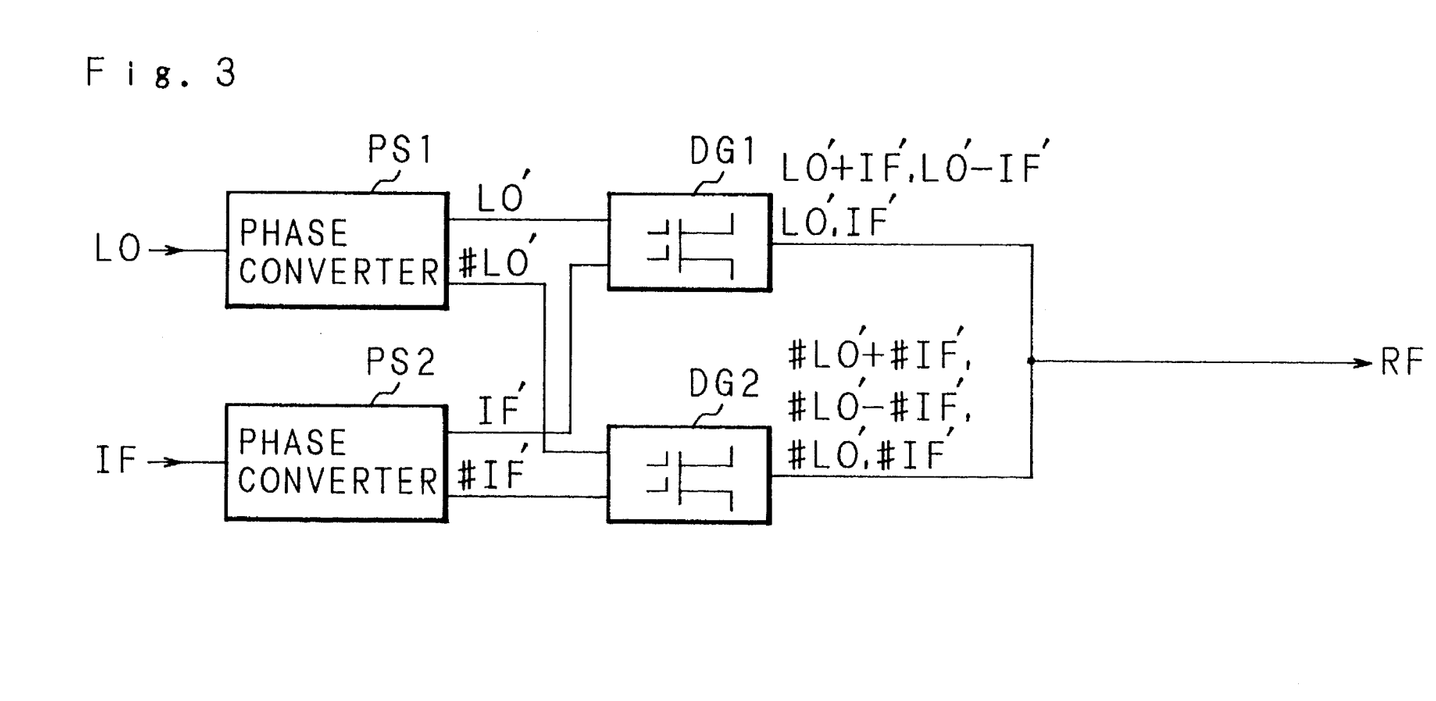
FIG. 3 is a block circuit diagram illustrative of the constitution of the double-balanced mixer circuit of the invention.

FIG. 3 is a block circuit diagram illustrative of the construction of a double-balanced mixer circuit of the invention. A local oscillation frequency signal LO having a frequency LO is inputted to a phase shifter PS1 comprising only passive elements, and an intermediate frequency signal IF having a frequency IF is inputted to a phase shifter PS2 comprising only passive elements. The phase shifter PS1 is made to output a signal LO' (frequency LO) with a phase lag of 90° from the local oscillation frequency signal LO and a signal #LO' (frequency LO) with a phase lead of 90° over the local oscillation frequency signal LO. The phase shifter PS2 is made to output a signal IF' (frequency IF) with a phase lag of 90° from the intermediate frequency signal IF and a signal #IF' (frequency IF) with a phase lead of 90° over the intermediate frequency signal IF.

The signal LO' output by the phase shifter PS1 is inputted to one input terminal of a dual gate circuit DG1 provided with, for example, a dual gate FET and the signal IF' output by the phase shifter PS2 is inputted to the other terminal of the dual gate circuit DG1. The signal output by #LO' of the phase shifter PS1 is inputted to one input terminal of a dual gate circuit DG2 provided with, for example, a dual gate FET and the signal #IF' output by the phase shifter PS2.

The dual gate circuit DG1 is made to mix the signal LO' and the signal IF', and the dual gate circuit DG2 is made to mix the signal #LO' and the signal #IF'. An output terminal of the dual gate circuit DG1 and an output terminal of the dual gate circuit DG2 are connected to each other, so that the signal output from the dual gate circuit DG1 and the signal output from the dual gate circuit DG2 are superposed. Then the radio frequency signal RF obtained by this superposition is output.

Figure 4:
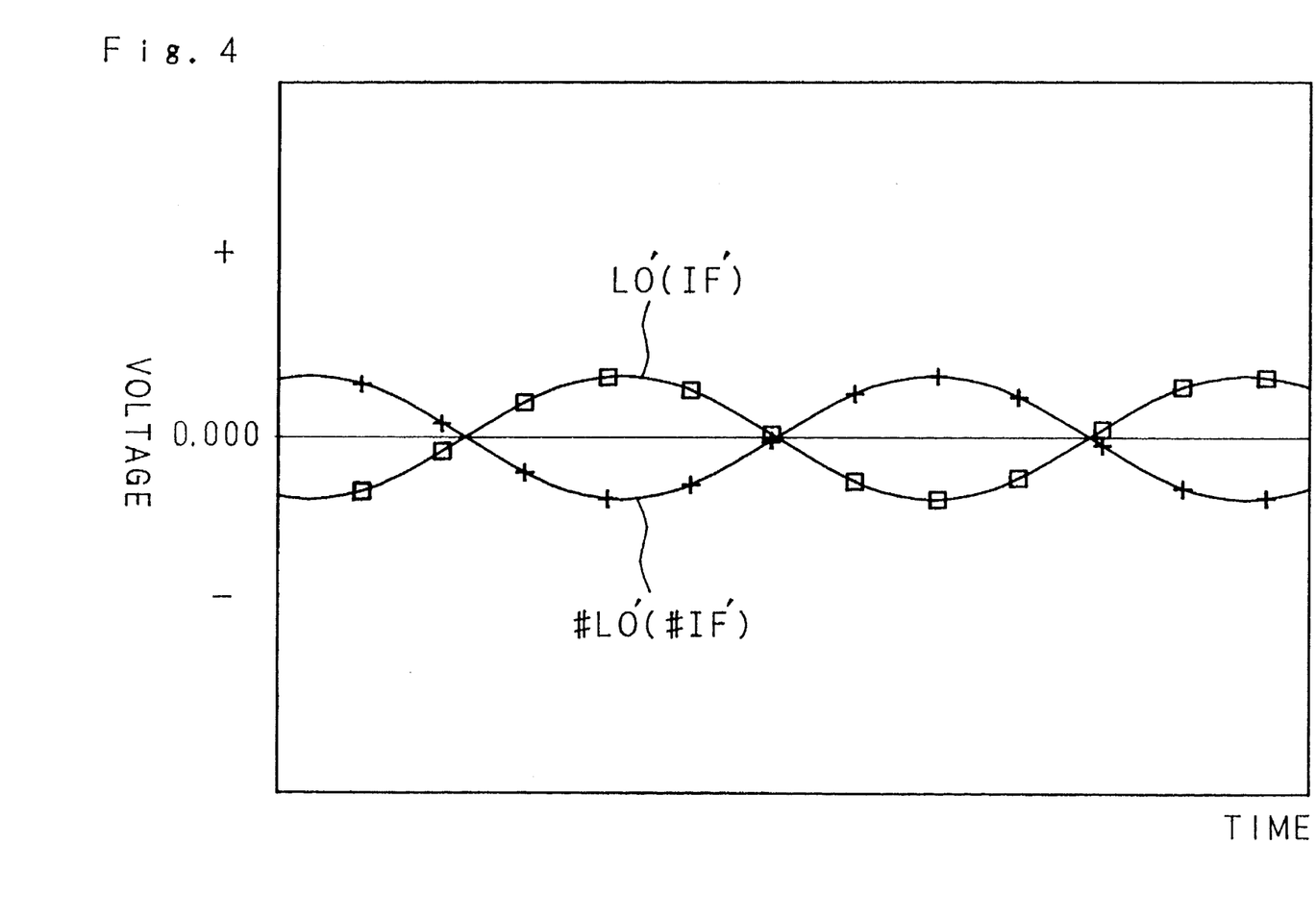
FIG. 4 is a phase characteristic diagram of an output signal of a phase shifter.

The operation of the double-balanced mixer circuit will now be described below with reference to FIG. 4 illustrative of the phase characteristic of the phase shifter PS1 (PS2).

When the local oscillation frequency signal LO is inputted to the phase shifter PS1, the phase shifter PS1 outputs a signal LO' with a phase lag of 90° from the local oscillation frequency signal LO and a signal #LO' with a phase lead of 90° over the local oscillation frequency signal LO as shown in FIG. 4. The signal LO' is inputted to one input terminal of the dual gate circuit DG1 and the signal #LO' is inputted to one input terminal of the dual gate circuit DG2. Similarly, when the intermediate frequency signal IF is inputted to the phase shifter PS2, the phase shifter PS2 outputs the signal IF' with a phase lag of 90° from the intermediate frequency signal IF and a signal #IF' with a phase lead of 90° over the intermediate frequency signal IF. The signal IF' is inputted to the other input terminal of the dual gate circuit DG1 and the signal #IF' is inputted to the other input terminal of the dual gate circuit DG2.

The dual gate circuit DG1 mixes the signal LO' and the signal IF' which have been inputted, and outputs signals LO'+IF' and LO'−IF' which are obtained by mixing and the individual signals LO' and IF'. The dual gate circuit DG2 mixes the signal #LO' and the signal #IF' which have been inputted, and outputs signals #LO'+#IF' and #LO'−#IF' which are obtained by mixing and the individual signals #LO' and #IF'.

These signals LO'+IF', LO'−IF', LO', IF', #LO'+#IF', #LO'−#IF', #LO' and #IF' are superposed (added) on the output side of the dual gate circuits DG1, DG2. The signal LO' and the signal #LO' cancel out each other because they have a phase difference of 180°, similarly the signal IF' and the signal #IF' cancel out each other because they have a phase difference of 180°, so that the individual signals LO', #LO', IF' and #IF' disappear.

The signal LO'+IF' and the signal LO'−IF' are generated from the component of the product of the signal LO' and the signal IF' by the dual gate FET applying the effect of the non-linear characteristic. Similarly the signal #LO'+#IF' and the signal #LO'−#IF' are generated from the component of the product of the signal #LO' and the signal #IF' by the dual gate FET applying the effect of the non-linear characteristic. The product of the signal #LO' having a phase being shifted by 180° from the signal LO' and the signal #IF' having a phase being shifted by 180° from the signal IF' has the same phase as the product of the signal LO' and the signal IF', so that the signal LO'+IF' is identical with the signal #LO'+#IF'. Similarly the signal LO'−IF' is identical with the signal #LO'−#IF'. Therefore the signal obtained by superposing the signals output by the dual gate circuit has twice in amplitude the signal output by the dual gate circuit.

Thus only the radio frequency signal RF which is generated by mixing is output with a high signal level, making it possible to obtain the output of the radio frequency signal RF of a high S/N ratio.

Also according to the invention, both the phase shifters PS1, PS2 are made by employing passive elements without using FETs, and the dual gate circuit is made by using a single dual gate FET. Therefore power consumption in the phase shifters PS1, PS2 and in the dual gate circuits DG1, DG2 can be greatly reduced. Also because no significant voltage drop occurs unlike the prior art wherein cascaded FETs are used, a low voltage power source can be used.

Moreover, the radio frequency signal RF is not subjected to distortion because phase shift is applied to the signals by using passive elements only. Furthermore, the circuit construction can be simplified because the dual gate circuit does not use many FETs. The dual gate FET provides excellent isolation of the local oscillation frequency signal LO and the intermediate frequency signal IF.

Figure 5:
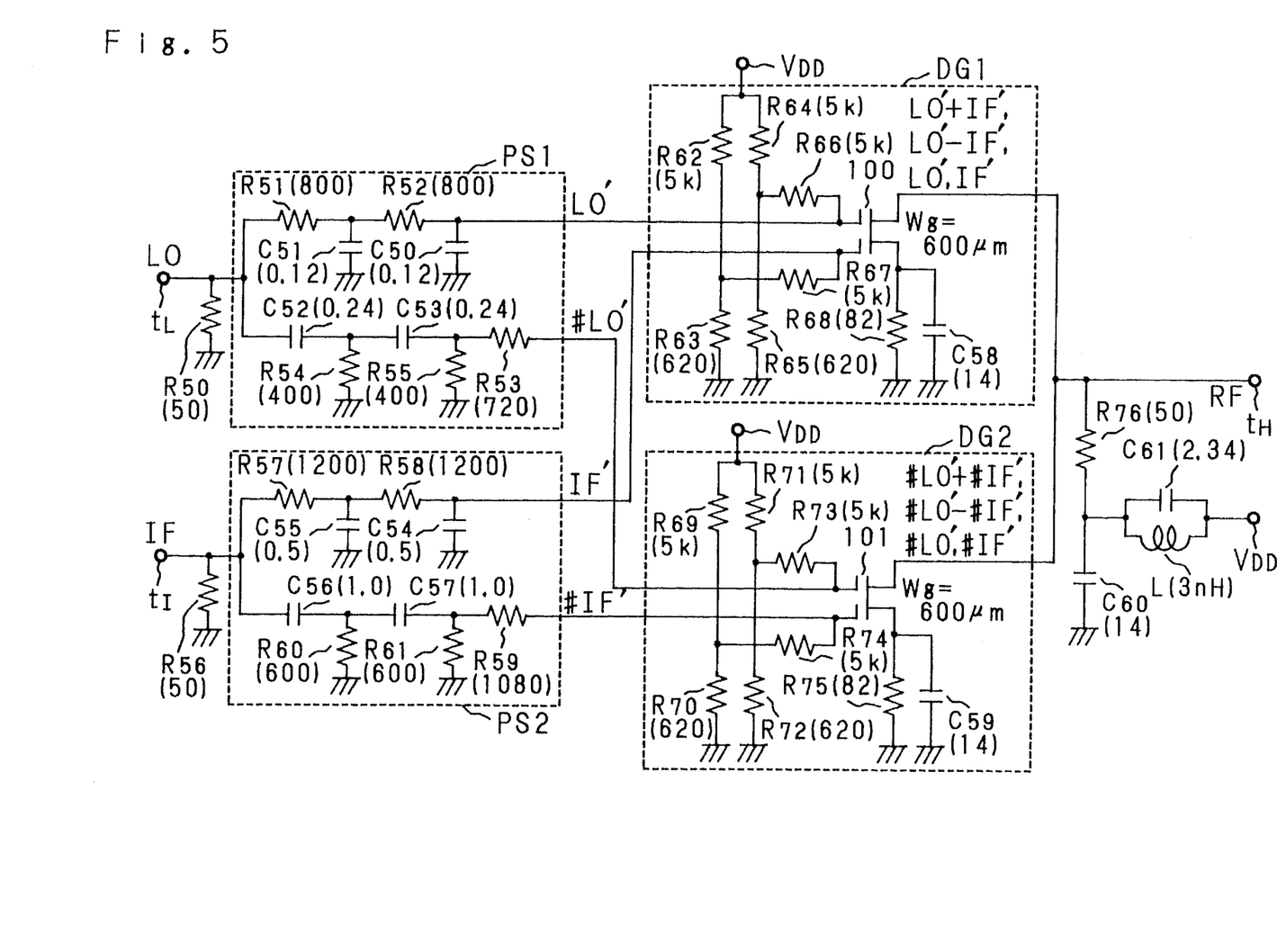
FIG. 5 is an actual circuit diagram of the double-balanced mixer circuit of the invention.

FIG. 5 shows a circuit diagram illustrative of an actual circuit of the double-balanced mixer circuit of the invention mounted on a GaAs substrate. Numerical figures appearing in parentheses in FIG. 5 are the values of resistance or capacitance in the conventional units of ohms or pico farads.

An input terminal $t_L$ for the local oscillation frequency signal LO is grounded via a resistor $R_{50}$ (50), and is grounded via a series circuit of a resistor $R_{51}$ (800), a resistor $R_{52}$ (800) and a capacitor $C_{50}$ (0.12). The junction of the resistor $R_{51}$ (800) and the resistor $R_{52}$ (800) is grounded via the capacitor $C_{51}$ (0.12). An input terminal $t_L$ is connected to one terminal of a resistor $R_{53}$ (720) via a series circuit of a capacitor $C_{52}$ (0.24) and a capacitor $C_{53}$ (0.24). The junction of the capacitors $C_{52}$ and $C_{53}$ is grounded via a resistor $R_{54}$ (400) and the junction of the capacitor $C_{53}$ and the resistor $R_{53}$ is grounded via a resistor $R_{55}$ (400). The phase shifter PS1 comprises the resistors $R_{51}$, $R_{52}$, $R_{53}$, $R_{54}$ and $R_{55}$ and the capacitors $C_{50}$, $C_{51}$, $C_{52}$ and $C_{53}$.

An input terminal $t_I$ for the intermediate frequency signal IF is grounded via a resistor $R_{56}$ (50), and is grounded via a series circuit of a resistor $R_{57}$ (1200), a resistor $R_{58}$ (1200) and a capacitor $C_{54}$ (0.5). The junction of the resistor $R_{57}$ (1200) and the resistor $R_{58}$ (1200) is grounded via a capacitor $C_{55}$ (0.5). The input terminal $t_I$ is connected to one terminal of a resistor $R_{59}$ (1080) via a series circuit of a capacitor $C_{56}$ (1.0) and a capacitor $C_{57}$ (1.0). The junction of the capacitor $C_{56}$ (1.0) and the capacitor $C_{57}$ (1.0) is grounded via a resistor $R_{60}$ (600) and the junction of the capacitor $C_{57}$ (1.0) and the resistor $R_{59}$ (1080) is grounded via a resistor $R_{61}$ (600). The phase shifter PS2 comprises the resistors $R_{57}$, $R_{58}$, $R_{59}$, $R_{60}$ and $R_{61}$ and the capacitors $C_{54}$, $C_{55}$, $C_{56}$ and $C_{57}$.

The power supply $V_{DD}$ is grounded via a series circuit of a resistor $R_{62}$ (5k) and a resistor $R_{63}$ (620), and is grounded via a series circuit of a resistor $R_{64}$ (5k) and a resistor $R_{65}$ (620). The junction of the resistor $R_{64}$ (5k) and the resistor $R_{65}$ (620) is connected to one input terminal (gate) of a dual gate FET 100 via a resistor $R_{66}$ (5k), and the junction of the resistor $R_{62}$ (5k) and the resistor $R_{63}$ (620) is connected to the other input terminal (gate) of a dual gate FET 100 via a resistor $R_{67}$ (5k). One output lead (source) of the dual gate FET 100 is grounded via a parallel circuit of a resistor $R_{68}$ (82) and a capacitor $C_{58}$ (14).

The gate width Wg of the dual gate FET 100 is made to be 600 μm, and both pairs of the gate and the source are biased to −0.3 V. The dual gate circuit DG1 comprises the dual gate FET 100, the resistors $R_{62}$, $R_{63}$, $R_{64}$, $R_{65}$, $R_{66}$, $R_{67}$, $R_{68}$ and the capacitor $C_{58}$.

The power supply $V_{DD}$ is grounded via a series circuit of a resistor $R_{69}$ (5k) and a resistor $R_{70}$ (620), and is grounded via a series circuit of a resistor $R_{71}$ (5k) and a resistor $R_{72}$ (620). The junction of the resistor $R_{71}$ (5k) and the resistor $R_{72}$ (620) is connected to one input terminal (gate) of a dual gate FET 101 via a resistor $R_{73}$ (5k). The junction of the resistor $R_{69}$ (5k) and the resistor $R_{70}$ (620) is connected to the other input terminal (gate) of the dual gate FET 101 via a resistor $R_{74}$ (5k).

One output terminal (source) of the dual gate FET 101 is grounded via a parallel circuit of a resistor $R_{75}$ (82) and a capacitor $C_{59}$ (14). The width of the gates Wg of the dual gate FET 101 are made to be 600 μm, and both pairs of the gate and the source are biased to −0.3 V. The dual gate circuit DG2 comprises the dual gate FET 101, the resistors $R_{69}$, $R_{70}$, $R_{71}$, $R_{72}$, $R_{73}$, $R_{74}$, $R_{75}$ and the capacitor $C_{59}$.

The junction of the resistor $R_{52}$ (800) and the capacitor $C_{50}$ (0.12) of the phase shifter PS1 is connected to one input terminal of the dual gate FET 100, and the junction of the resistor $R_{58}$ (1200) and the capacitor $C_{54}$ (0.5) of the phase shifter PS2 is connected to the other input terminal of the dual gate FET 100. The other terminal of the resistor $R_{53}$ (720) of the phase shifter PS1 is connected to one input terminal of the dual gate FET 101, and the other terminal of the resistor $R_{59}$ (1080) of the phase shifter PS2 is connected to the other input terminal of the dual gate FET 101.

The other output (drain) of the dual gate FET 100 and the other input (drain) of the dual gate FET 101 are combined and connected to a radio frequency output terminal $t_H$ whereon the radio frequency signal RF is output. The radio frequency output terminal $t_H$ is grounded via a series circuit of a resistor $R_{76}$ (50) and a capacitor $C_{60}$ (14). The junction of the resistor $R_{76}$ (50) and the capacitor $C_{60}$ (14) is connected to the power supply $V_{DD}$ via a parallel circuit of a capacitor $C_{61}$ (2.34) and a coil L of 3 nH. The voltage of the power supply $V_{DD}$ is set to 3 V.

Figure 6:
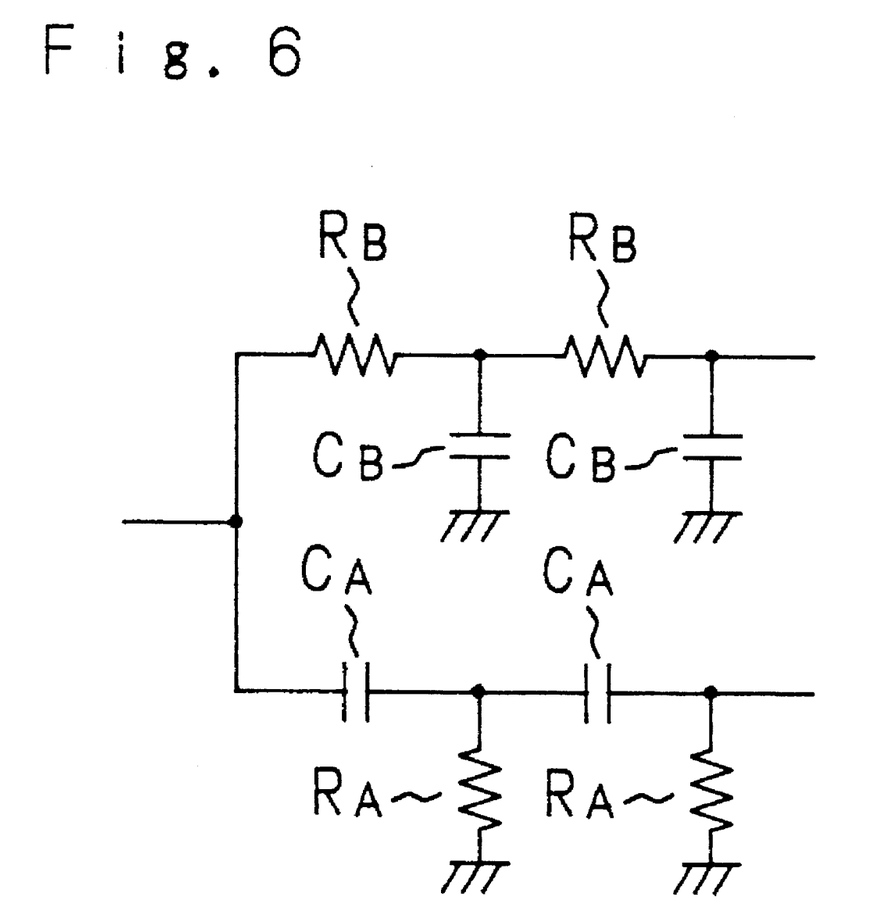
FIG. 6 is an equivalent circuit diagram of a phase shifter comprising resistors and capacitors.

FIG. 6 shows an equivalent circuit diagram explanatory of the conditions to determine the values of the resistors and capacitors of the phase shifters PS1, PS2. Resistors $R_{51}$, $R_{52}$ of the phase shifter PS1 shown in FIG. 5 correspond to $R_B$, $R_B$, resistors $R_{54}$, $R_{55}$ correspond to $R_A$, $R_A$, capacitors $C_{50}$, $C_{51}$ correspond to $C_B$, $C_B$, and capacitors $C_{52}$, $C_{53}$ correspond to $C_A$, $C_A$. Resistors $R_{57}$, $R_{58}$ of the phase shifter PS2 correspond to $R_B$, $R_B$, resistors $R_{60}$, $R_{61}$ correspond to $R_A$, $R_A$, capacitors $C_{54}$, $C_{55}$ correspond to $C_B$, $C_B$, and capacitors $C_{56}$, $C_{57}$ correspond to $C_A$, $C_A$. The values of the resistors and the capacitors are determined by the following formulae.

$$R_B = 2 \cdot R_A \tag{1}$$

$$C_B = (\tfrac{1}{2}) \cdot C_A \tag{2}$$

where $$1/(R_A \cdot C_A) = 1/(R_B \cdot C_B) = 2\pi f \tag{3}$$

must be satisfied. Frequency f is 1.65 GHz for the local oscillation frequency signal LO, and 0.25 GHz for the intermediate frequency signal IF.

When the local oscillation frequency signal LO and the intermediate frequency signal IF are inputted to the double-balanced mixer circuit having the construction as described above, the phase shifter PS1 outputs a signal LO' with a phase lag of 90° from the local oscillation frequency signal LO and a signal #LO' with a phase lead of 90° over the local oscillation frequency signal LO, and the phase shifter PS2 outputs a signal IF' with a phase lag of 90° from the intermediate frequency signal IF and a signal #IF' with a phase lead of 90° over the intermediate frequency signal IF, as described previously. The dual gate circuit DG1 mixes the signal LO' and the signal IF', and the dual gate circuit DG2 mixes the signal #LO' and the signal #IF'.

Mixed signals LO'+IF', LO'−IF', #LO'+#IF' and #LO'−#IF' are output from the dual gate circuits DG1, DG2, and are superposed to produce the radio frequency signals RF, having frequencies of LO+IF and LO−IF and twice the amplitude of the original signal, which are output at the radio frequency output terminal $t_H$. The signals LO' and IF' which are output individually from the dual gate circuit DG1 and the signals #LO' and #IF' which are output individually from the dual gate circuit DG2 cancel out each other and disappear.

It was verified with this actual circuit that, when the local oscillation frequency signal LO having a frequency of 1.65 GHz and the intermediate frequency signal IF having a frequency of 0.25 GHz were inputted with a level of −5 dBm, radio frequency signal RF having a frequency of 1.9 GHz was obtained with a voltage amplitude of 50 mV.

As described above, because the dual gate circuits and the phase shifters which do not employ FETs and transistors but passive elements are used in the double-balanced mixer circuit of the invention, power consumption can be greatly reduced. Also because no significant voltage drop occurs in the phase shifters and the dual gate circuits, a low voltage power source can be used. Moreover, even when signals having large amplitudes are inputted to the phase shifter, distortion of the signal is prevented by building the phase shifter of passive elements.

Figure 7:
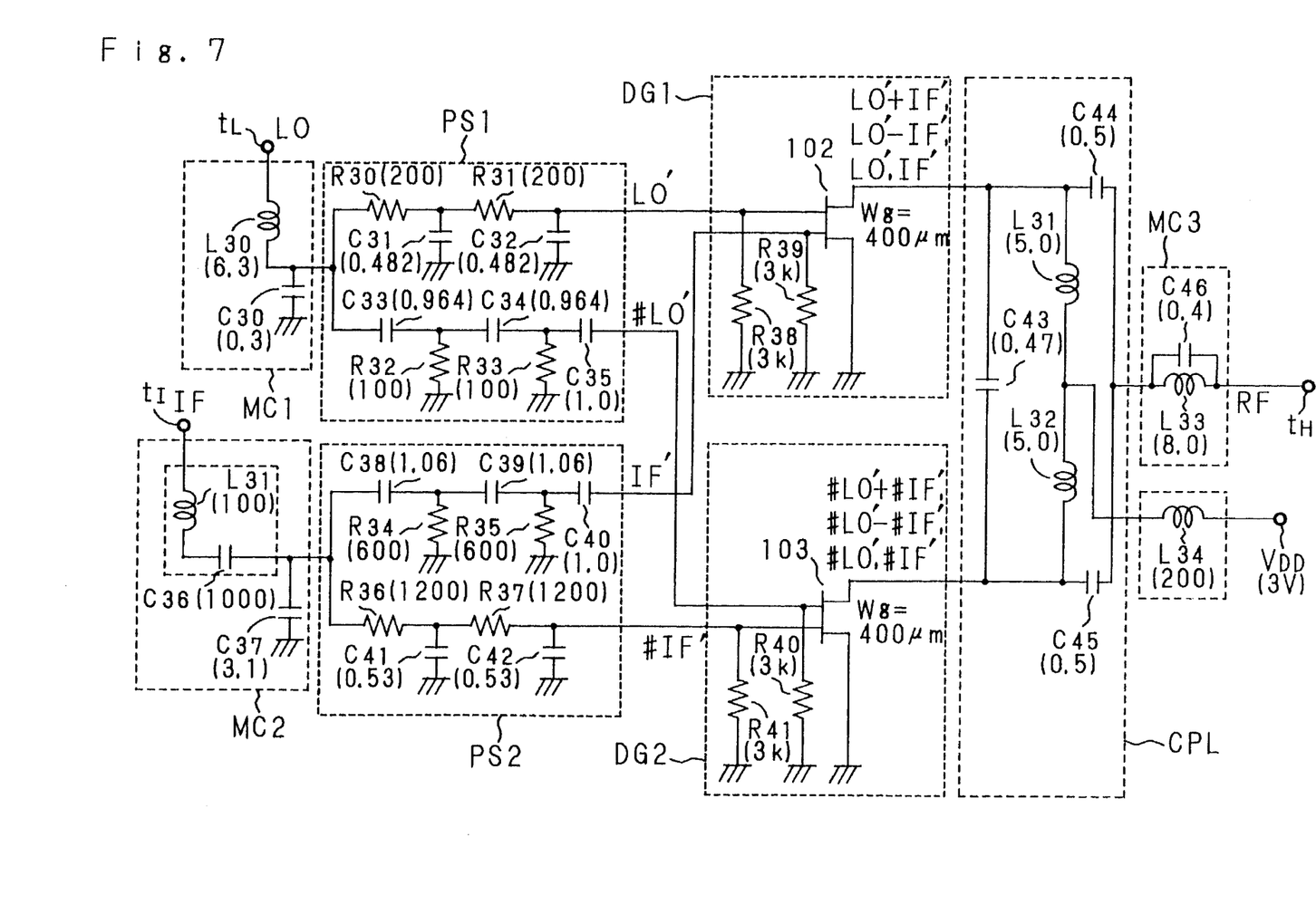
FIG. 7 is an actual circuit diagram illustrative of another constitution of the double-balanced mixer circuit of the invention.

FIG. 7 shows an actual circuit diagram illustrative of another embodiment of the double-balanced mixer circuit of the invention. Numerical figures indicated in parentheses in FIG. 7 are the values of inductance, resistance and capacitance in units of nH, ohms and pico farads, respectively.

An input terminal $t_L$ for the local oscillation frequency signal LO is grounded via a series circuit of a coil $L_{30}$ (6.3) and a capacitor $C_{30}$ (0.3). A matching circuit MC1 comprises the coil $L_{30}$ (6.3) and the capacitor $C_{30}$ (0.3). The junction of the coil $L_{30}$ (6.3) and the capacitor $C_{30}$ (0.3) is grounded via a series circuit of a resistor $R_{30}$ (200), a resistor $R_{31}$ (200) and a capacitor $C_{32}$ (0.482), and the junction of the resistor $R_{30}$ (200) and the resistor $R_{31}$ (200) is grounded via a capacitor $C_{31}$ (0.482).

The junction of the coil $L_{30}$ (6.3) and the capacitor $C_{30}$ (0.3) is grounded via a series circuit of the capacitor $C_{33}$ (0.964) and the capacitor $C_{34}$ (0.964) and the resistor $R_{33}$ (100). The junction of the capacitor $C_{33}$ (0.964) and the capacitor $C_{34}$ (0.964) is grounded via the resistor $R_{32}$ (100). The junction of the capacitor $C_{34}$ (0.964) and the resistor $R_{33}$ (100) is connected to one lead of the capacitor $C_{35}$ (1.0). The phase shifter PS1 comprises the resistors $R_{30}$, $R_{31}$, $R_{32}$, $R_{33}$ and the capacitors $C_{31}$, $C_{32}$, $C_{33}$, $C_{34}$, $C_{35}$.

An input terminal $t_I$ for the intermediate frequency signal IF is grounded via a series circuit of a coil $L_{31}$ (100), a capacitor $C_{36}$ (1000) and a capacitor $C_{37}$ (3.1). The coil $L_{31}$ (100) and the capacitor $C_{36}$ (1000) are connected on the outside. A matching circuit MC2 comprises the coil $L_{31}$ and the capacitors $C_{36}$, $C_{37}$. The junction of the capacitor $C_{36}$ (1000) and the capacitor $C_{37}$ (3.1) is grounded via a series circuit of a capacitor $C_{38}$ (1.06), a capacitor $C_{39}$ (1.06) and a resistor $R_{35}$ (600). The junction of the capacitor $C_{38}$ (1.06) and the capacitor $C_{39}$ (1.06) is grounded via the resistor $R_{34}$ (600). The junction of the capacitor $C_{39}$ (1.06) and the resistor $R_{35}$ (600) is connected to one terminal of a capacitor $C_{40}$ (1.0).

The junction of the capacitor $C_{36}$ (1000) and the capacitor $C_{37}$ (3.1) is grounded via a series circuit of a resistor $R_{36}$ (1200), a resistor $R_{37}$ (1200) and a capacitor $C_{42}$ (0.53). The junction of the resistor $R_{36}$ (1200) and the resistor $R_{37}$ (1200) is grounded via a capacitor $C_{41}$ (0.53). The phase shifter PS2 comprises the resistors $R_{34}$, $R_{35}$, $R_{36}$, $R_{37}$ and the capacitors $C_{38}$, $C_{39}$, $C_{40}$, $C_{41}$ and $C_{42}$.

The junction of the resistor $R_{31}$ (200) and the capacitor $C_{32}$ (0.482) of the phase shifter PS1 is connected to one terminal (gate) of the dual gate FET 102, and the other terminal of the capacitor $C_{40}$ (1.0) of the phase shifter PS2 is connected to the other input terminal (gate) of the dual gate FET 102. One input terminal of the dual gate FET 102 is grounded via a resistor $R_{38}$ (3k), and the other input terminal is grounded via a resistor $R_{39}$ (3k). The gate width Wg of the dual gate FET 102 is made to be 400 μm, and the gate length of one input terminal 0.7 μm and the gate length of the other input terminal 0.5 μm.

The junction of the resistor $R_{37}$ (1200) and the capacitor $C_{42}$ (0.53) of the phase shifter PS2 is connected to one input terminal (gate) of the dual gate FET 103, and the other terminal of the capacitor $C_{35}$ (1.0) of the phase shifter PS1 is connected to the other input terminal (gate) of the dual gate FET 103. One input terminal of the dual gate FET 103 is grounded via a resistor $R_{41}$ (3k), and the other input terminal is grounded via a resistor $R_{40}$ (3k). The gate width Wg of the dual gate FET 103 is made to be 400 μm, and the gate length of one input lead 0.7 μm and gate length of the other input terminal 0.5 μm.

The dual gate circuit DG1 comprises the dual gate FET 102 and the resistors $R_{38}$, $R_{39}$, and the dual gate circuit DG2 comprises the dual gate FET 103 and the resistors $R_{40}$, $R_{41}$. One output terminal (source) of each of the dual gate FET 102 and the dual gate FET 103 is grounded. A capacitor $C_{43}$ (0.47) is inserted between the other output terminal (drain) of the dual gate FET 102 and the other output terminal (drain) of the dual gate FET 103, and the capacitor $C_{43}$ (0.47) is connected with a parallel pair of a series circuit of a coil $L_{31}$ (5.0) and a coil $L_{32}$ (5.0) and a series circuit of a capacitor $C_{44}$ (0.5) and a capacitor $C_{45}$ (0.5).

A coupler CPL comprises the capacitor $C_{43}$, the coils $L_{31}$, $L_{32}$ and the capacitors $C_{44}$, $C_{45}$. The junction of the capacitor $C_{44}$ (0.5) and the capacitor $C_{45}$ (0.5) is connected with a radio frequency output terminal $t_H$ where the radio frequency signal RF is output, via a parallel circuit of a capacitor $C_{46}$ (0.4) and a coil $L_{33}$ (8.0). The junction of the coil $L_{31}$ (5.0) and the coil $L_{32}$ (5.0) is connected the power supply $V_{DD}$ via a coil $L_{34}$ (200) which is connected on the outside. A matching circuit MC3 comprises the capacitor $C_{46}$ and the coil $L_{33}$.

The coupler CPL are constructed so that the impedance of the coupler CPL at the radio frequency output terminal $t_H$ side plus the output impedance of the dual gate FET 102 is greater than the impedance of the circuit to be connected to the radio frequency output terminal $t_H$.

When the local oscillation frequency signal LO and the intermediate frequency signal IF are inputted to the double-balanced mixer circuit of the constitution as described above, the phase shifter PS1 outputs the signal LO' having a phase lag of 90° from the local oscillation frequency signal LO and the signal #LO' having a phase lead of 90° over the local oscillation frequency signal LO, and the phase shifter PS2 outputs the signal IF' having a phase lag of 90° from the intermediate frequency signal IF and the signal #IF' having a phase lead of 90° over the intermediate frequency signal IF, similarly as described previously. The dual gate circuit DG1 mixes the signal LO' and the signal IF', and the dual gate circuit DG2 mixes the signal #LO' and the signal #IF'.

Mixed signals LO'+IF', LO'−IF', #LO'+#IF', #LO'−#IF', and the individual signals LO', IF', #LO', #IF' are output from the dual gate circuits DG1, DG2, and are superposed on the output side of the coupler CPL, to provide the radio frequency signals RF, having frequencies of LO+IF and LO−IF and twice the amplitude of the original signal, at the radio frequency output terminal $t_H$.

The signals LO' and IF' which are output individually from the dual gate circuit DG1 and the signals #LO' and #IF' which are output individually from the dual gate circuit DG2 cancel out each other thereby to disappear.

By providing the coupler CPL, it is made less likely that the signals LO'+IF', LO'−IF' which are output from the dual gate circuit DG1 via the capacitor $C_{44}$ (0.5) flow to the dual gate circuit DG2. It is also made less likely that the signals #LO'+#IF', #LO'−#IF' which are output from the dual gate circuit DG2 via the capacitor $C_{45}$ (0.5) flow to the dual gate circuit DG1. Therefore, the levels of the mixed signals LO'+IF', LO'−IF', #LO'+#IF', #LO'−#IF' do not decrease on the output side of the coupler CPL, and these signals can be superposed with high efficiency and output at the radio frequency output terminal $t_H$.

It was verified experimentally that, when the power voltage $V_{DD}$ was set to 3 V, the frequency of the local oscillation frequency signal LO was set to 1.65 GHz, the frequency of the intermediate frequency signal IF was set to 0.25 GHz, and the frequency of the radio frequency signal RF was set to 1.9 GHz, conversion gain of 0 dBm was obtained from the input of the local oscillation frequency signal LO of 5 dBm and the input of the intermediate frequency signal IF of 0 dBm.

Figure 8:
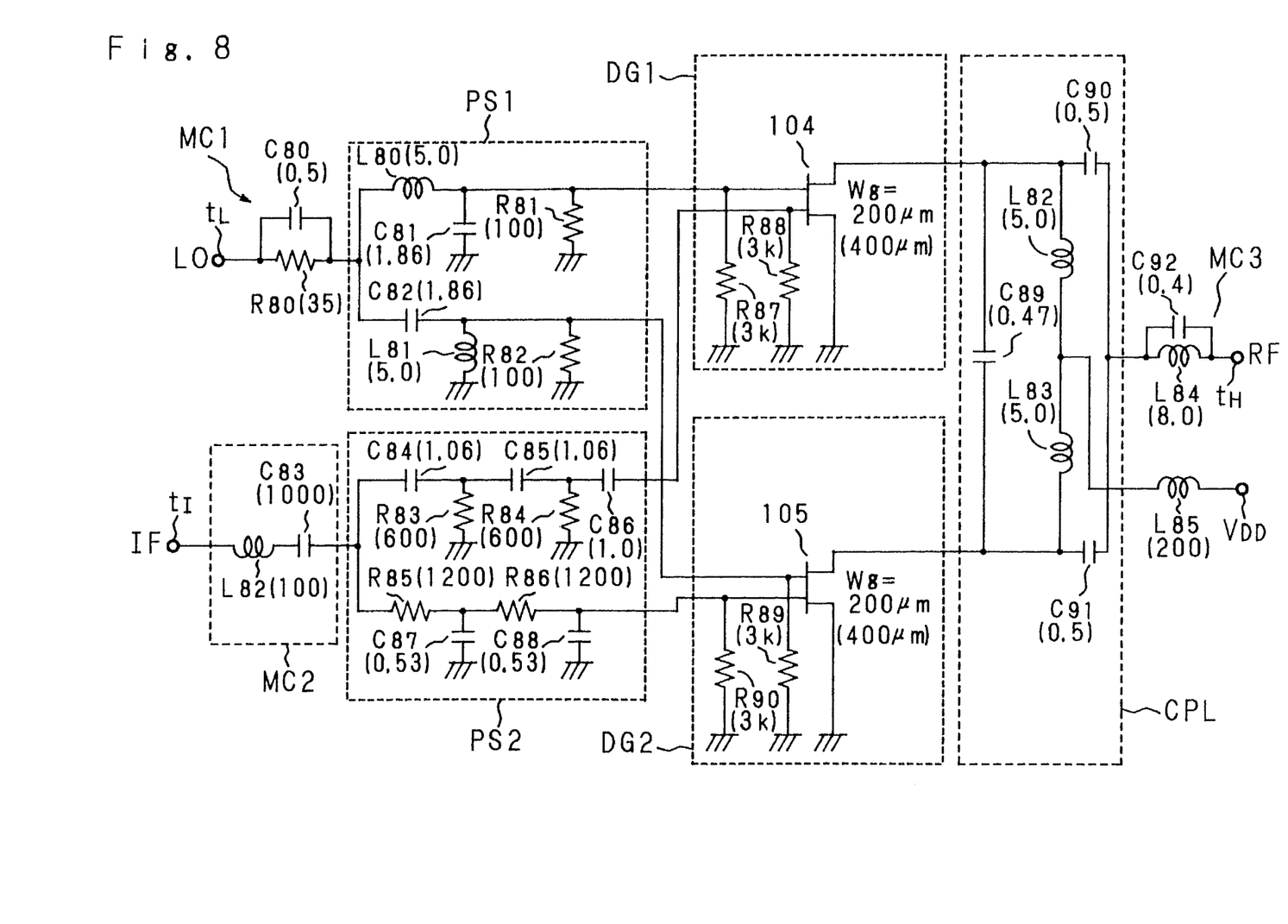
FIG. 8 is an actual circuit diagram illustrative of further another constitution of the double-balanced mixer circuit of the invention.

FIG. 8 shows an actual circuit diagram illustrative of further another constitution of the double-balanced mixer circuit of the invention. Numerical figures indicated in parentheses in FIG. 8 are the values of inductance, resistance and capacitance in the unit of nH, ohm and pico farad, respectively.

An input terminal $t_L$ for the local oscillation frequency signal LO is grounded via a parallel circuit of a capacitor $C_{80}$ (0.5) and a resistor $R_{80}$ (35) and a series circuit of a coil $L_{80}$ (5.0) and a resistor $R_{81}$ (100). The junction of the coil $L_{80}$ (5.0) and the resistor $R_{81}$ (100) is grounded via a capacitor $C_{81}$ (1.86). The junction of the capacitor $C_{80}$ (0.5), the resistor $R_{80}$ (35) and the coil $L_{80}$ (5.0) is grounded via a series circuit of a capacitor $C_{82}$ (1.86) and a resistor $R_{82}$ (100), and the junction of the capacitor $C_{82}$ (1.86) and the resistor $R_{82}$ (100) is grounded via a coil $L_{81}$ (5.0). A matching circuit MC1 comprises the capacitor $C_{80}$ and the resistor $R_{80}$. The phase shifter PS1 comprises the coils $L_{80}$, $L_{81}$, the capacitors $C_{81}$, $C_{82}$ and the resistor $R_{81}$, $R_{82}$.

An input terminal $t_I$ for the intermediate frequency signal IF is grounded via a series circuit of a coil $L_{82}$ (100), a capacitor $C_{83}$ (1000), a capacitor $C_{84}$ (1.06), a capacitor $C_{85}$ (1.06) and a resistor $R_{84}$ (600). The junction of the capacitor $C_{84}$ (1.06) and the capacitor $C_{85}$ (1.06) is grounded via a resistor $R_{83}$ (600). The junction of the resistor $R_{84}$ (600) the and capacitor $C_{85}$ (1.06) is connected to one terminal of a capacitor $C_{86}$ (1.0).

The junction of the capacitor $C_{83}$ (1000) and the capacitor $C_{84}$ (1.06) is grounded via a series circuit of a resistor $R_{85}$ (1200), a resistor $R_{86}$ (1200) and a capacitor $C_{88}$ (0.53), and the junction of the resistor $R_{85}$ (1200) and the resistor $R_{86}$ (1200) is grounded via a capacitor $C_{87}$ (0.53). The coil $L_{82}$ and the capacitor $C_{83}$ are connected on the outside, and a matching circuit MC2 comprises the coil $L_{82}$ and the capacitor $C_{83}$. The phase shifter PS2 comprises the capacitors $C_{84}$, $C_{85}$, $C_{86}$, $C_{87}$, $C_{88}$ and the resistors $R_{83}$, $R_{84}$, $R_{85}$, $R_{86}$.

The junction of the coil $L_{80}$ (5.0), the capacitor $C_{81}$ (1.86) and the resistor $R_{81}$ (100) of the phase shifter PS1 is connected to one terminal (gate) of the dual gate FET 104. The other terminal of the capacitor $C_{86}$ (1.0) of the phase shifter PS2 is connected to the other input lead (gate) of the dual gate FET 104. One input terminal of the dual gate FET 104 is grounded via a resistor $R_{87}$ (3k), and the other input terminal is grounded via a resistor $R_{88}$ (3k). The gate width Wg of the dual gate FET 104 is made to be 200 or 400 μm. The dual gate circuit DG1 comprises the dual gate FET 104, resistors $R_{87}$ and $R_{88}$.

The junction of the resistor $R_{86}$ (1200) and the capacitor $C_{88}$ (0.53) of the phase shifter PS2 is connected to one input terminal (gate) of the dual gate FET 105. The junction of the capacitor $C_{82}$ (1.86), the coil $L_{81}$ (5.0) and the resistor $R_{82}$ (100) of the phase shifter PS1 is connected to the other input terminal (gate) of the dual gate FET 105. One input terminal of the dual gate FET 105 is grounded via a resistor $R_{90}$ (3k), and the other input terminal is grounded via a resistor $R_{89}$ (3k). The gate width of the dual gate FET 105 is made to be 200 or 400 μm. The dual gate circuit DG2 comprises the dual gate FET 105, the resistors $R_{89}$ and $R_{90}$.

One output terminal (source) of the dual gate FET 104 and one output terminal (source) of the dual gate FET 105 are grounded. A capacitor $C_{89}$ (0.47) is inserted between the other output terminal (drain) of the dual gate FET 104 and the other output terminal (drain) of the dual gate FET 105. The capacitor $C_{89}$ (0.47) is connected to a parallel combination of a series circuit of the coil $L_{82}$ (5.0) and the coil $L_{83}$ (5.0) and a series circuit of a capacitor $C_{90}$ (0.5) and a capacitor $C_{91}$ (0.5).

A coupler CPL comprises the capacitors $C_{89}$, $C_{90}$, $C_{91}$ and the coils $L_{82}$, $L_{83}$. The junction of the capacitor $C_{90}$ (0.5) and the capacitor $C_{91}$ (0.5) is connected with the radio frequency output terminal $t_H$, where the radio frequency signal RF is output, via a parallel circuit of a capacitor $C_{92}$ (0.4) and a coil $L_{84}$ (8.0). A matching circuit MC3 comprises the capacitor $C_{92}$ and the coil $L_{84}$. The junction of the coil $L_{82}$ (5.0) and the coil $L_{83}$ (5.0) is connected to the power supply $V_{DD}$ via a coil $L_{85}$ (200).

The coupler CPL is constructed so that the impedance of the coupler CPL at the radio frequency output terminal $t_H$ side plus the output impedance of the dual gate FET 104 is greater than the impedance of the circuit to be connected to the radio frequency output terminal $t_H$.

Figure 9:
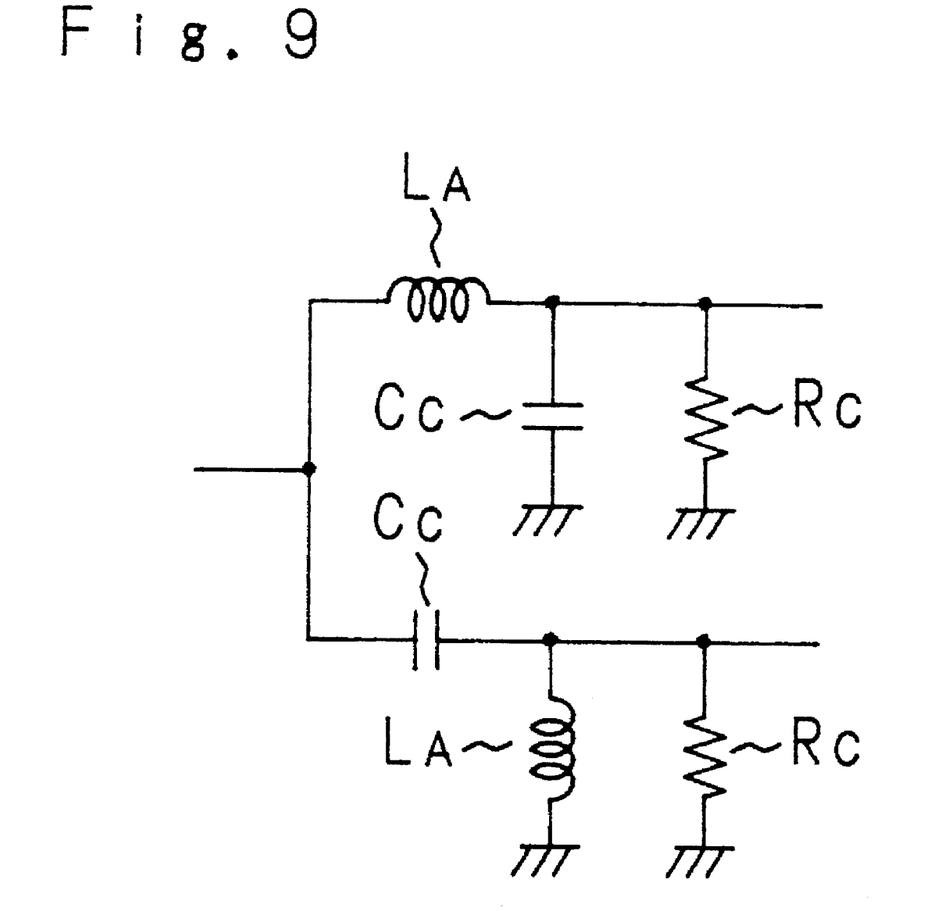
FIG. 9 is an equivalent circuit diagram of a phase shifter comprising coils, resistors and capacitors.

FIG. 9 shows an equivalent circuit diagram explanatory of the conditions to determine the values of the coils, resistors and capacitors of the phase shifter PS1. The coils $L_{80}$, $L_{81}$ of the phase shifter PS1 shown in FIG. 8 correspond to $L_A$, $L_A$, the resistors $R_{81}$, $R_{82}$ correspond to $R_C$, $R_C$, and the capacitors $C_{81}$, $C_{82}$ correspond to $C_C$, $C_C$. The values of the coils, resistors and capacitors are determined by the following formula.

$$(L_A \cdot C_C)^{-1/2} = 2\pi f \qquad (4)$$

Where frequency f is 1.65 GHz for the local oscillation frequency signal LO, and 0.25 GHz for the intermediate frequency signal IF.

When the local oscillation frequency signal LO and the intermediate frequency signal IF are inputted to the double-balanced mixer circuit of the constitution as described above, the phase shifter PS1 outputs a signal LO' having a phase lag of 90° from the local oscillation frequency signal LO and a signal #LO' with a phase lead of 90° over the local oscillation frequency signal LO, similarly as described previously. And the phase shifter PS2 outputs a signal IF' having a phase lag of 90° from the intermediate frequency signal IF and a signal #IF' having a phase lead of 90° over the intermediate frequency signal IF, similarly as described previously. The dual gate circuit DG1 mixes the signal LO' and the signal IF', and the dual gate circuit DG2 mixes the signal #LO' and the signal #IF'. This is followed by an operation similar to that described previously, to provide the radio frequency signal RF having frequencies of LO+IF and LO−IF at the radio frequency output terminal $t_H$.

The voltage gain of the phase shifter PS1, which is the ratio of the output voltage to the input voltage thereof, is determined by the values of the coils, resistors and capacitors which constitute the phase shifter. When the values of the coils, resistors and capacitors which constitute the phase shifter PS1 are as shown in FIG. 8, the voltage gain of 5.6 dB is obtained for the phase shifter PS1 with a coefficient X for determining the voltage gain being given by the formula (5) from which X=0.26 is obtained.

$$X = (L_A / C_C)^{1/2} / (2 \cdot R_C) \qquad (5)$$

Thus a voltage gain comparable to that obtained with a phase shifter comprising resistors and capacitors can be obtained, thereby verifying that the phase shifter having the construction as described above can be used in a practical application similarly to the phase shifter comprising resistors and capacitors.

Because this embodiment has, in addition to the effects of foregoing embodiments, the effect of making it less likely that the signal which is output to the output side of the coupler flow to the dual gate circuit, the signal level does not decrease at the output side of the coupler, thereby enabling it to efficiently superpose the signals on the output side of the coupler.

Although one phase shifter PS1 comprises the coils, resistors and capacitors and another phase shifter PS2 comprises the resistors and capacitors in this embodiment, the phase shifter PS2 can also be made from coils, resistors and capacitors. While the coil becomes larger in size in this case which makes it impossible to incorporate it in the MMIC (Monolithic Micro wave IC), connecting the phase shifter to the IC on the outside makes this construction applicable to practical use.

Although a case of mixing the local oscillation frequency signal and the intermediate frequency signal is described in this embodiment, the invention can also be applied with similar effects, for example, to a reception signal mixer circuit, an analog multiplier circuit, a frequency conversion circuit or the like where it is required to mix signals of different frequencies.

Although the phase shifters comprises only passive elements in foregoing embodiments, the phase shifters can also comprise FETs. In this case power consumption is larger than foregoing embodiments, but it can be made smaller than the prior art because the dual gate circuit is used for performing the double-balance.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A double-balanced mixer circuit for mixing a first input signal of a first frequency and a second input signal of a second frequency comprising:

a first phase shifter, comprising passive elements, having an input, and receiving at said input the first input signal and providing as outputs a first output signal having a phase lag of 90° from said first input signal and a second output signal having a phase lead of 90° from said first input signal;

a second phase shifter, comprising passive elements, having an input, and receiving at said input the second input signal and providing as outputs a third output signal having a phase lag of 90° from said second input signal and a fourth output signal having a phase lead of 90° from said second input signal;

wherein the passive elements forming each of said first and second phase shifters comprise only resistors and capacitors between said input and an output of a respective said phase shifter, the passive elements of each said phase shifter having an equivalent electrical circuit represented by first and second branches originating from said input of a respective said phase shifter; said first branch of the equivalent electrical circuit having first and second resistances each of value $R_3$ connected in series at a junction and in series with said phase shifter input, a capacitance of value $C_B$ connected from the junction of said first and second resistances to a common potential point, and another capacitance of value $C_B$ connected from the end of the resistance remote from the said phase shifter input to the common potential point, said second branch of the electrical equivalent circuit having first and second capacitances each of a value $C_A$ connected in series at a junction and in series to said phase shifter input, and a resistance of a value $R_A$ connected from the junction of the first and second capacitances to the common potential point and another resistance of value $R_A$ connected from the end of the capacitance remote from the input to the common potential point, and wherein $$R_B = 2 \cdot R_A \tag{1}$$

$$C_B = (\tfrac{1}{2}) \cdot C_A \tag{2}$$

where $$1/(R_A \cdot C_A) = 1/(R_B C_B) = 2\pi f \tag{3}$$

and where f is the frequency of one of the signals of a first frequency and a second frequency;

a first dual gate mixer circuit having an input and an output and a dual gate FET receiving as inputs said first and third output signals and mixing the same to produce at said output said first output signal and said third output signal;

a second dual gate mixer circuit having an input and an output and a dual gate FET receiving as inputs said second output signal and said fourth output signal and mixing the same to produce at said output said second output signal and said fourth output signal; and combining means coupled to said output of each of said first dual gate mixer circuit and said second dual gate mixer circuit for providing a combined output signal by combining said first output signal outputted from said first dual gate mixer circuit and said second output signal outputted from said second dual gate mixer circuit to cancel each other, and said third output signal outputted from said first dual gate mixer circuit and said fourth output signal outputted from said second dual gate mixer circuit to cancel each other.

2. A double-balanced mixer circuit as claimed in claim 1, further comprising an output terminal connected to said combining means and means for producing at said output terminal a further output signal of a frequency corresponding to a selected one of the sum of and the difference between the first frequency and the second frequency.

3. A double-balanced mixer circuit as in claim 1 wherein said first dual gate mixer circuit also produces as outputs fifth and sixth output signals which are respectively the sum and difference of said first and third output signals and further outputs said first input signal, and said second dual gate mixer circuit also produces as outputs seventh and eighth output signals which are respectively the sum and difference of said second and fourth output signals and further outputs said second input signal, and said combining means cancelling said fifth and seventh output signals outputted respectively from said first and second dual gate mixer circuits and cancelling said sixth and eighth output signals outputted respectively from said first and second dual gate mixer circuits and producing a signal having a frequency corresponding to a selected one of the sum of and the difference between the first frequency and the second frequency.

4. A double-balanced mixer circuit for mixing a first input signal of a first frequency and a second input signal of a second frequency comprising:

a first phase shifter, comprising passive elements, having an input, and receiving at said input the first input signal and providing as outputs a first output signal having a phase lag of 90° from said first input signal and a second output signal having a phase lead of 90° from said first input signal;

a second phase shifter, comprising passive elements, having an input, and receiving at said input the second input signal and providing as outputs a third output signal having a phase lag of 90° from said second input signal and a fourth output signal having a phase lead of 90° from said second input signal;

wherein the passive elements forming each of said first and second phase shifters comprise only resistors and capacitors between said input and an output of a respective said phase shifter, the passive elements of each said phase shifter having an equivalent electrical circuit represented by first and second branches originating from said input of a respective said phase shifter;

said first branch of the equivalent electrical circuit having first and second resistances each of value $R_B$ connected in series at a junction and in series with said phase shifter input, a capacitance of value $C_B$ connected from the junction of said first and second resistances to a common potential point, and another capacitance of value $C_B$ connected from the end of the resistance remote from the said phase shifter input to the common potential point, said second branch of the electrical equivalent circuit having first and second capacitances each of a value $C_A$ connected in series at a junction and in series to said phase shifter input, and a resistance of a value $R_A$ connected from the junction of the first and second capacitances to the common potential point, and another resistance of value $R_A$ connected from the end of the capacitance remote from the input to the common potential point, and wherein $$R_B = 2 \cdot R_A \tag{1}$$

$$C_B = (\tfrac{1}{2}) \cdot C_A \tag{2}$$

where $$1/(R_A \cdot C_A) = 1/(R_B \cdot C_B) = 2\pi f \tag{3}$$

and where f is the frequency and one of the signals of a first frequency and a second frequency;

a first dual gate mixer circuit having an input and an output and a dual gate FET receiving as inputs said first and third output signals and mixing the same to produce at said output said first output signal and said third output signal;

a second dual gate mixer circuit having an input and an output and a dual gate FET receiving as inputs said second output signal and said fourth output signal and mixing the same to produce at said output said second output signal and said fourth output signal; and a coupler for combining the output signals of the first dual gate mixer circuit and the output signals of the second dual gate mixer circuit and to output to an output terminal a resultant signal whose frequency is a selected one of a sum of and a difference between the signal of a first frequency and the signal of a second frequency for supply to an external circuit.

5. A double-balanced mixer circuit for mixing a first input signal of a first frequency and a second input signal of a second frequency comprising:

a first phase shifter, comprising passive elements, having an input, and receiving at said input the first input signal and providing as outputs a first output signal having a phase lag of 90° from said first input signal and a second output signal having a phase lead of 90° from said first input signal;

a second phase shifter, comprising passive elements, having an input, and receiving at said input the second input signal and providing as outputs a third output signal having a phase lag of 90° from said second input signal and a fourth output signal having a phase lead of 90° from said second input signal;

the passive elements forming at least one of said phase shifters comprising only resistors, capacitors and inductors between said input and output of said at least one phase shifter, the passive elements of said at least one phase shifter having an equivalent electrical circuit represented by first and second branches originating from said input of said at least one phase shifter, said first branch of the electrical equivalent circuit having an inductance of value $L_A$ with one end connected to said input of said at least one phase shifter and a capacitance of value $C_C$ and a resistance of value $R_C$ connected in parallel from the other end of the inductance to a point of reference potential and said second branch of said equivalent electrical circuit having a capacitance of value $C_C$ with one end connected to said input of said at least one phase shifter and an inductance of value $L_A$ and a resistance of value $R_C$ connected in parallel from the other end of said capacitance to the point of reference potential, wherein $$(L_A \cdot C_C)^{-1/2} = 2\pi f$$

and where f is the frequency of one of the signals of a first frequency and second frequency;

a first dual gate mixer circuit having an input and an output and a dual gate FET receiving as inputs said first and third output signals and mixing the same to produce at said output said first output signal and said third output signal;

a second dual gate mixer circuit having an input and an output and a dual gate FET receiving as inputs said second output signal and said fourth output signal and mixing the same to produce at said output said second output signal and said fourth output signal; and means coupled to the output of each of said first dual gate mixer circuit and second dual gate mixer circuit for combining the first signal outputted from the first dual gate mixer circuit and the second signal outputted from the second dual gate mixer circuit to cancel each other, and to combine the third signal outputted from the first dual gate mixer circuit and the fourth signal outputted from the second dual gate mixer circuit to cancel each other.

6. A double-balanced mixer as in claim 5 wherein the phase shifter has a voltage gain X given by $$X = (L_A/C_C)^{1/2}/(2 \cdot CR_C).$$

7. A double-balanced mixer circuit as in claim 5 wherein said first dual gate mixer circuit also produces at its output fifth and sixth signals which are respectively the sum and difference of said first and third signals and further outputs said signal of a first frequency, and said second dual gate mixer circuit also produces at its output seventh and eighth signals which are respectively the sum and difference of said second and fourth signals and further outputs said signal of a second frequency, and said combining means cancelling said fifth and seventh signals outputted respectively from said first and second dual gate mixer circuits and cancelling said sixth and eighth signals outputted respectively from said first and second dual gate mixer circuits and producing a signal having a frequency corresponding to a selected one of the sum of and the difference between the signal of a first frequency and the signal of a second frequency.

8. A double-balanced mixer circuit as in claim 5 wherein said means for combining also has an output terminal at which it produces a resultant signal whose frequency is a selected one of the sum of and the difference between the signal of a first frequency and the signal of a second frequency.

9. A double-balanced mixer circuit for mixing a first input signal of a first frequency and a second input signal of a second frequency comprising:

a first phase shifter, comprising passive elements, having an input, and receiving at said input the first input signal and providing as outputs a first output signal having a phase lag of 90° from said first input signal and a second output signal having a phase lead of 90° from said first input signal;

a second phase shifter, comprising passive elements, having an input, and receiving at said input the second input signal and providing as outputs a third output signal having a phase lag of 90° from said second input signal and a fourth output signal having a phase lead of 90° from said second input signal;

the passive elements forming at least one of said phase shifters comprising only resistors, capacitors and inductors between said input and output of said at least one phase shifter, the passive elements of said at least one phase shifter having an equivalent electrical circuit represented by first and second branches originating from said input of said at least one phase shifter, said first branch of the electrical equivalent circuit having an inductance of value $L_A$ with one end connected to said input of said at least one phase shifter and a capacitance of value $C_C$ and a resistance of value $R_C$ connected in parallel from the other end of the inductance to a point of reference potential and said second branch of said equivalent electrical circuit having a capacitance of value $C_C$ with one end connected to said input of said at least one phase shifter and an inductance of value $L_A$ and a resistance of value $R_C$ connected in parallel from the other end of said capacitance to the point of reference potential, wherein $$(L_A \cdot C_C)^{-1/2} = 2\pi f$$

and where f is one of the signals of the first frequency and second frequency;

a first dual gate mixer circuit having an input and an output and a dual gate FET receiving as inputs said first and third output signals and mixing the same to produce at said output said first output signal and said third output signal;

a second dual gate mixer circuit having an input and an output and a dual gate FET receiving as inputs said second output signal and said fourth output signal and mixing the same to produce at said output said second output signal and said fourth output signal; and a coupler for combining the output signals of the first dual gate mixer circuit and the output signals of the second dual gate mixer circuit and to output to an output terminal a resultant signal whose frequency is a selected one of the sum of and the difference between the signal of a first frequency and the signal of a second frequency for supply to an external circuit; and wherein the impedance of the components forming the coupler plus the output impedances of the FET of the first mixer circuit and the second mixer circuit is greater than the impedance of an external circuit connected to the coupler output terminal.

10. A double-balanced mixer as in claim 9 wherein the phase shifter has a voltage gain X given by $$X = (L_A/C_C)^{1/2}/(2 \cdot CR_C).$$

11. A double-balanced mixer circuit as in claim 9 wherein said coupler includes means for combining the first signal outputted from said first dual gate mixer circuit and the second signal outputted from said second dual gate circuit to cancel each other, and the first signal outputted from said first dual gate mixer circuit and the fourth signal outputted from said second dual gate mixer circuit to cancel each other.

* * * * *